United States Patent
Huang et al.

(10) Patent No.: US 7,247,939 B2
(45) Date of Patent: Jul. 24, 2007

(54) METAL FILLED SEMICONDUCTOR FEATURES WITH IMPROVED STRUCTURAL STABILITY

(75) Inventors: Yi-Chen Huang, Hsin-Chu (TW); Chao-Chen Chen, Hsin-Tsu County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 68 days.

(21) Appl. No.: 10/405,593

(22) Filed: Apr. 1, 2003

(65) Prior Publication Data
US 2004/0198057 A1   Oct. 7, 2004

(51) Int. Cl.
   *H01L 23/48* (2006.01)
   *H01L 27/15* (2006.01)

(52) U.S. Cl. .............. 257/700; 257/E27.104; 257/E21.577; 257/E21.279; 257/E21.276; 257/E21.584; 257/E21.579; 257/701; 257/775; 257/774; 257/776; 257/737; 257/758; 257/750; 257/310; 174/263

(58) Field of Classification Search ........ 257/E27.104, 257/E21.577, E21.279, E21.276, E21.584, 257/E21.579, 310, 734, 773–776, 758, 750, 257/700, 701, 692; 174/263
See application file for complete search history.

(56) References Cited

U.S. PATENT DOCUMENTS

| | | | | |
|---|---|---|---|---|
| 5,989,991 A * | 11/1999 | Lien | ............................ | 438/612 |
| 6,043,119 A * | 3/2000 | Wu et al. | .................... | 438/254 |
| 6,232,662 B1 * | 5/2001 | Saran | ......................... | 257/750 |
| 6,261,953 B1 * | 7/2001 | Uozumi | ...................... | 438/687 |
| 6,277,757 B1 * | 8/2001 | Lin | ............................. | 438/704 |
| 6,287,988 B1 * | 9/2001 | Nagamine et al. | .......... | 438/770 |
| 6,403,444 B2 * | 6/2002 | Fukuzumi et al. | .......... | 438/396 |
| 6,410,435 B1 * | 6/2002 | Ryan | ......................... | 438/687 |
| 6,437,387 B2 * | 8/2002 | Gutsche | ...................... | 257/301 |
| 6,461,887 B1 * | 10/2002 | Pradeep et al. | ............... | 438/43 |
| 6,586,334 B2 * | 7/2003 | Jiang | ......................... | 438/687 |
| 6,635,561 B2 * | 10/2003 | Kawai et al. | ............... | 438/622 |

(Continued)

FOREIGN PATENT DOCUMENTS

JP     10-242649     * 9/1998

(Continued)

OTHER PUBLICATIONS

Kwak "Method for forming contact hole of semicondcutor device" Derwent-AcCC_No. 2002-596561, Samsung Eleectronics Co Ltd [SMSU] Abstract.*

(Continued)

*Primary Examiner*—Alexander Oscar Williams
(74) *Attorney, Agent, or Firm*—Tung & Associates

(57) ABSTRACT

A method for forming a metal filled semiconductor feature with improved structural stability including a semiconductor wafer having an anisotropically etched opening formed through a plurality of dielectric insulating layers revealing a first etching resistant layer overlying a conductive area; a plurality of dielectric insulating layers sequentially stacked to have alternating etching rates to a preferential etching process; subjecting the anisotropically etched opening to the preferential etching process whereby the sidewalls of the anisotropically etched opening are preferentially etched to produce etched dielectric insulating layers to form roughened sidewall surfaces; anisotropically etching through the etching resistant layer to reveal the conductive area; and, filling the anisotropically etched opening with a metal to form a metal filled semiconductor feature.

20 Claims, 2 Drawing Sheets

U.S. PATENT DOCUMENTS

| | | |
|---|---|---|
| 6,656,840 B2 * | 12/2003 | Rajagopalan et al. ........ 438/687 |
| 6,682,984 B1 * | 1/2004 | Wu et al. ..................... 438/397 |
| 6,737,345 B1 * | 5/2004 | Lin et al. ..................... 438/601 |
| 6,784,704 B2 * | 8/2004 | Sato ............................ 327/143 |
| 6,806,138 B1 * | 10/2004 | Cheng et al. ................. 438/243 |
| 6,876,021 B2 * | 4/2005 | Martin et al. ................ 257/295 |
| 2001/0051420 A1 * | 12/2001 | Besser et al. ................ 438/597 |
| 2003/0020163 A1 * | 1/2003 | Hung et al. .................. 257/734 |
| 2003/0068867 A1 * | 4/2003 | Forster et al. ............... 438/386 |
| 2003/0137056 A1 * | 7/2003 | Taniguchi et al. ........... 257/774 |
| 2004/0029462 A1 * | 2/2004 | Herbkersman et al. ...... 440/111 |
| 2004/0067643 A1 * | 4/2004 | Liu et al. ..................... 438/687 |
| 2004/0101663 A1 * | 5/2004 | Agarwala et al. ............ 428/209 |
| 2004/0145045 A1 * | 7/2004 | Huang et al. ................. 257/700 |
| 2005/0186801 A1 * | 8/2005 | Uno et al. .................... 438/706 |

FOREIGN PATENT DOCUMENTS

| | | |
|---|---|---|
| JP | 10-326965 | * 12/1998 |

OTHER PUBLICATIONS

Kwak, B, Method for forming contact hole of semicondcutor device, Mar. 9, 2002, KR-2002018822A, Derwent-ACC No. 2002-596561, Abstract.*

* cited by examiner

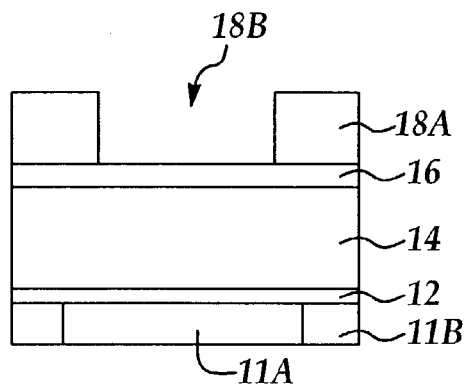
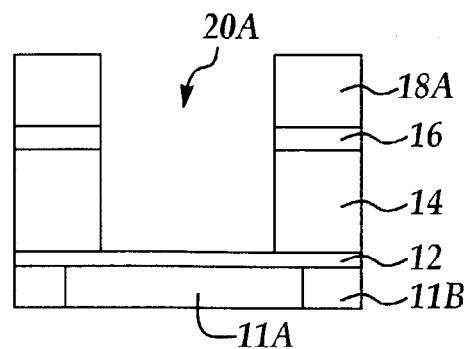
*Figure 1A*
*Prior Art*
*Figure 1B*
*Prior Art*
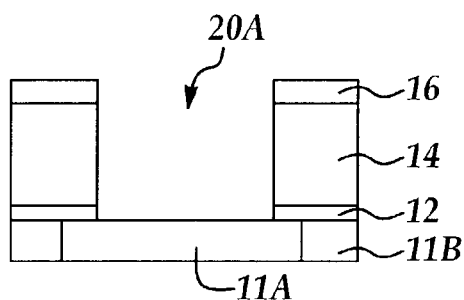
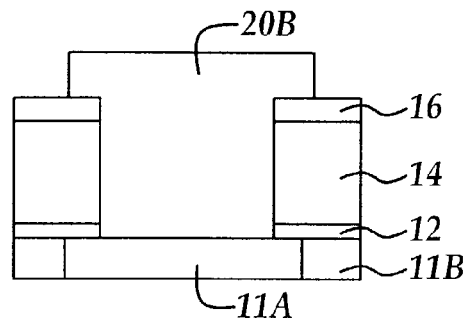
*Figure 1C*
*Prior Art*
*Figure 1D*
*Prior Art*
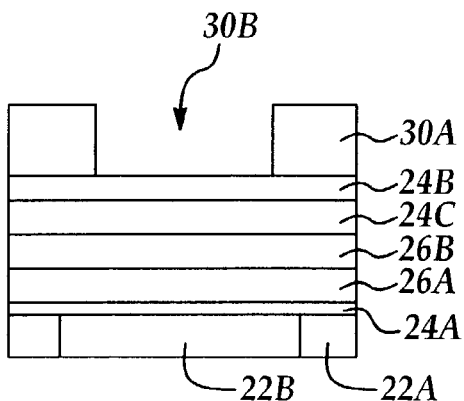
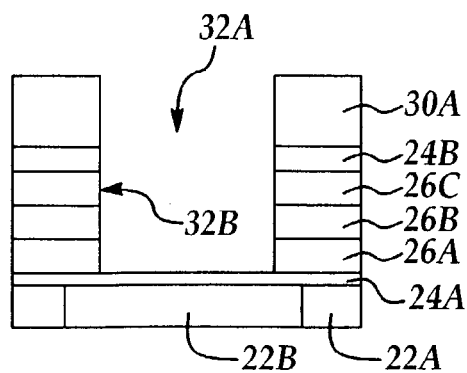
*Figure 2A*
*Figure 2B*

METAL FILLED SEMICONDUCTOR FEATURES WITH IMPROVED STRUCTURAL STABILITY

FIELD OF THE INVENTION

This invention generally relates to the formation of metal filled semiconductor features and more particularly to a method for forming metal filled semiconductor features having improved structural stability to prevent or avoid peeling.

BACKGROUND OF THE INVENTION

In typical multilayer semiconductor device the uppermost layers which are electrically interconnected with underlying layers by way of, for example, vias, additionally include bonding pads for forming electrical connection with the semiconductor device (chip) surface to a package which contains the chip. The bonding pads are typically formed in an array on the individual die or chips likewise forming an array on the semiconductor wafer surface.

In forming wire bonding pads on the chip upper surface for subsequent wire bonding from the chip to a package frame by various techniques, a conductive area, for example copper, is covered by a series of passivation layers in which an opening is subsequently anisotropically etched to form closed communication with the copper conductive area and filled with another metal, for example aluminum or an aluminum/copper alloy.

For example, referring to FIG. 1A is shown a portion of a multilevel semiconductor device including a stage in formation of a bonding pad including conductive area 11A formed in dielectric insulating layer 11B having an overlying silicon oxynitride or silicon nitride etching stop liner 12. Overlying the etching stop liner 12 is a passivating dielectric insulating layer 14 typically formed of undoped silica glass (USG) with an overlying layer of silicon nitride 16. A photoresist layer 18A is deposited and photolithographically patterned to form an opening 18B for anisotropically etching a bonding pad opening.

Referring to FIG. 1B, the bonding pad opening 20A is anisotropically etched through the silicon nitride layer 16 and the USG layer 14 to form closed communication with the etching stop liner 12. Referring to FIG. 1C, the photoresist layer 18A is then removed by a plasma ashing process and another anisotropic etching step is carried out to etch through the etching stop liner 12 to reveal the underlying conductive 11A to complete the formation of bonding pad opening 20A. Referring to FIG. 1D, the bonding pad opening is filled with an aluminum or aluminum copper alloy to form wire bonding pad 20B.

One problem with the prior art method of formation of wire bonding pads is that adhesion of the metal bonding pad, for example aluminum or aluminum/copper alloy, to the passivation layers is poor. As a result, during wire bonding operations including for example, thermocompression or thermosonic wire bonding, a downward compressive force is exerted causing some deformation of the bonding pad as well an upward force on removing the wire bonding stylus. The bonding pad is further subjected to a variety of other stresses during the packaging process including stresses caused by heating and cooling together with thermal coefficients of expansion mismatches between the various materials. Frequently, the exposure of the wire bonding pad to repeated stresses causes peeling of the bonding pad due to poor adhesion of the wire bonding pad the passivation layers and to the underlying conductive area, for example, copper. As a result, chip yields are reduced leading to costly re-working procedures.

There is therefore a need in the semiconductor processing art to develop a method whereby metal filled semiconductor features are formed to improve structural stability to avoid or prevent peeling during subsequent processing steps.

It is therefore an object of the invention to provide a method whereby metal filled semiconductor features are formed to improve structural stability to avoid or prevent peeling during subsequent processing steps while overcoming other deficiencies and shortcomings of the prior art.

SUMMARY OF THE INVENTION

To achieve the foregoing and other objects, and in accordance with the purposes of the present invention, as embodied and broadly described herein, the present invention provides a method for forming a metal filled semiconductor feature with improved structural stability.

In a first embodiment, the method includes providing a semiconductor wafer including an anisotropically etched opening formed through a plurality of dielectric insulating layers to reveal an first etching resistant layer overlying a conductive area said plurality of dielectric insulating layers sequentially stacked to have sequentially alternating etching rates to a preferential etching process; subjecting the anisotropically etched opening to the preferential etching process whereby the sidewalls of said anisotropically etched opening are preferentially etched to produce preferentially etched dielectric insulating layers according to the sequentially alternating etching rates to form roughened sidewall surfaces; anisotropically etching through the etching resistant layer to reveal the conductive area; and, filling the anisotropically etched opening with a metal to form a metal filled semiconductor feature.

These and other embodiments, aspects and features of the invention will be better understood from a detailed description of the preferred embodiments of the invention which are further described below in conjunction with the accompanying Figures.

BRIEF DESCRIPTION OF THE DRAWINGS

FIGS. 1A–1D are representative cross sectional side view representations of portions of multilayer semiconductor device at stages in a manufacturing process to form a bonding pad according to the prior art.

FIGS. 2A–2F are representative cross sectional side view representations of portions of multilayer semiconductor device at stages in an exemplary manufacturing process to form an exemplary metal filled semiconductor feature e.g., a bonding pad, according to the present invention.

DETAILED DESCRIPTION OF THE PREFERRED EMBODIMENTS

Figure 2C:
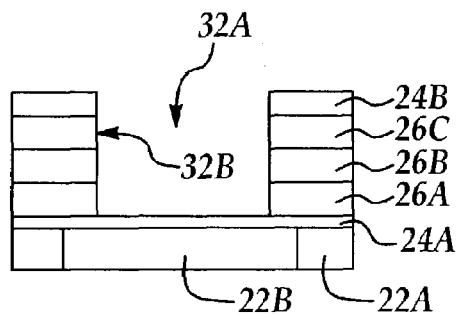

Although the method of the present invention is explained with reference to formation of a bonding pad, it will be appreciated that the method of the present invention may be advantageously used to improve the structural stability of smaller dimensioned metal filled semiconductor feature including, for example, metal filled damascene structures, wide trenches and contact pads.

In one embodiment of the present invention, an anisotropically etched semiconductor feature (opening) is formed through a plurality of dielectric insulating layers to form closed communication with an underlying etching resistant layer overlying a conductive area. The anisotropically etched opening is formed for subsequently filling with metal. The plurality of dielectric layers is stacked to have alternating etching rates to a preferential etching process including etching the sidewalls of the anisotropically etched opening. The anisotropically etched opening is then subjected to a preferential etching process whereby dielectric layers having a relatively higher etching rate are preferentially etched along the sidewalls of the anisotropically etched opening to form a preferentially etched surface. The anisotropically etched opening is subsequently anisotropically etched through a thickness of the underlying etching resistant layer to reveal the conductive area and the anisotropically etched opening is filled with metal to form a metal filled semiconductor feature.

Optionally, a conventional planarizing process including chemical mechanical polishing (CMP) is then carried out to planarize the surface of the metal filled semiconductor feature.

Preferably, the plurality of dielectric layers forming the sidewalls of the anisotropically etched opening have varying etching rates and are stacked to have alternating etching rates with respect to the preferential etching process carried out on the sidewalls of the anisotropically etched opening, where the stacked dielectric layers forming at least a portion of the sidewalls of the anisotropically etched opening, and where each sequentially stacked dielectric layer is formed of a material having a different etching rite compared to at least one of the underlying and overlying dielectric layers.

In another embodiment, at least two different insulating dielectric materials having different etching rates in the preferential etching process are used to form the plurality of stacked dielectric layers to produce a stack of dielectric layers having etching rates sequentially alternating between a relatively higher etching rate dielectric layer and a relatively lower etching rate dielectric material. Preferably, any two adjacent sequentially stacked dielectric layers have relative etching rates with respect to each other of about 2:1 to about 50:1.

In another embodiment, preferably, the preferential etching process produces preferential etching with respect the sequentially stacked dielectric layers such that alternate layers are preferentially etched in a direction perpendicular to the sidewall of the etched opening to form a recess in alternating layers having a depth equal to about ½ to about 2 times the thickness of the preferentially etched dielectric layer.

In another embodiment, preferably, the etched opening is a bonding pad opening for forming a bonding pad having a thickness of from about 0.3 microns to about 5 microns. Preferably, the preferential etching process produces a roughened surface whereby isotropic etching takes place substantially perpendicularly with respect to the sidewalls, for example, forming serpentine shaped sidewalls formed within the bonding pad opening including alternating peaks and valleys corresponding to relatively varying etching rates according to preferential etching of the relatively higher etching rate dielectric insulating layers included in the sidewalls. Preferably, a recessed area having a depth (preferential etching depth) measured from a low point(valley) of the recess in the higher etching rate dielectric layers compared to the high point (peak) of an adjacent lower etching rate dielectric layer is from about 200 Angstroms to about 700 Angstroms. Preferably, the thickness of each of the dielectric insulating layers has a thickness of from about 100 Angstroms to about 1000 Angstroms.

In another embodiment, the plurality of dielectric insulating layers (dielectric layers) are stacked such that a dielectric layer having a relatively higher etching rate terms the first dielectric layer formed over an underlying etching resistant layer, for example, a metal nitride layer, followed by a second dielectric layer having a relatively lower etching rate compared to the first dielectric layer where the sequence of a high etching rate dielectric layer followed by a low etching rate dielectric layer is repeated upward in the stack to end, for example, with an uppermost relatively higher etching rate dielectric layer. Preferably, an overlying second etching resistant layer, for example a metal nitride layer, for example silicon nitride, is formed over the uppermost dielectric insulating layer, the stack of dielectric insulating layers is sandwiched between the etching resistant layers and stacked for example, to form an odd number of relatively higher etching rate dielectric layers and an even number of relatively lower etching rate dielectric layers.

In another embodiment, preferably, the plurality of dielectric layers includes alternating layers of undoped silica glass (USG) and fluorinated silica glass (FSG). Preferably, the alternating layers of USG and FSG are sandwiched between etching resistant layers. The etching resistant layers preferably have a higher etching resistance to the preferential etching process compared to the plurality of dielectric insulating layers, where the etching resistant layers, for example, include at least one of silicon nitride and silicon oxynitride.

Referring to FIG. 2A, in an exemplary embodiment of the present invention including yet other preferred embodiments, is shown a portion of a multi-level semiconductor device at a stage in a manufacturing process for forming a semiconductor feature, for example, a bonding pad. A conductive area 22B, for example copper, is formed in a dielectric insulating layer 22A also referred to as an intermetal dielectric (IMD) layer, formed of, for example, a low dielectric constant (e.g., less than about 3.0) material such as carbon doped oxide or carbon/fluorine doped oxide. Formed over the dielectric insulating layer 22A is an etching stop liner 24A, formed of, for example, silicon nitride or silicon oxynitride. Overlying the etching stop liner 24A are formed a series (plurality) of passivation layers having alternating etching rates to a halocarbon containing etchant. The passivation layers are also referred to herein as dielectric insulating layers, and formed of, for example, undoped silica glass (USG) e.g., 26A, 26C formed of silicon dioxide and having interleaved dielectric insulating layers e.g., 26B formed of fluorinated silica glass (FSG). The fluorinated silica glass may be doped with fluorine to a level of about 6 percent as is known in the art.

It will be appreciated that at least two or more of the passivation layers (dielectric insulating layers) are preferably formed, the number depending on the dielectric layer thickness and the depth of the etched opening. For example, the passivation layers are formed having a thickness of about 100 Angstroms to about 1000 Angstroms. Formed over the passivation layers (dielectric insulating layers) e.g., 26A, 26B, 26C, is a metal nitride capping layer 24B, preferably including silicon nitride having a thickness of about 500 Angstroms to about 5000 Angstroms. Photoresist layer 30A is formed over the silicon nitride capping layer 24B and photolithographically patterned by conventional methods to form a patterned opening 30B for etching, e.g., anisotropically, a bonding pad opening.

Still referring to FIG. 2A, the IMD layer 22A is formed by conventional methods including CVD processes including plasma enhanced CVD (PECVD), high density plasma CVD (HDP-CVD), or spin on methods where, for example, spin-on glass (SOG) is used to form the IMD layer. The etching stop layer 24A and capping layer 24B are formed by a conventional CVD process, for example, a low pressure CVD (LPCVD) or PECVD process. The patterned opening 30B is formed by a conventional photolithographic patterning process including exposing and developing the photoresist layer 30A. The USG and FSG layers are formed by, for example, a conventional PECVD or HDP-CVD processes where the FSG is formed by adding $SiF_4$ to the process gas ambient (e.g., silane and oxygen) used to deposit the USG ($SiO_2$).

Referring to FIG. 2B, an anisotropic plasma etching process also referred to as a dry etch including for example, a reactive ion etch (RIE) process or plasma etching process is carried out to first anisotropically etch through the capping layer 24B, followed by anisotropically etching through the passivation layers, e.g., 26C, 26B, and 26A to expose etching stop liner 24A to form bonding pad opening 32A having sidewalls, e.g., 32B. A conventional anisotropic etching chemistry is used including for example, fluorocarbons, oxygen, and hydrogen as etching gases.

Referring to FIG. 2C, the photoresist layer 30A is removed by a conventional plasma ashing process including oxygen prior to carrying out a preferential etching process according to an embodiment of the present invention.

Figure 2D:
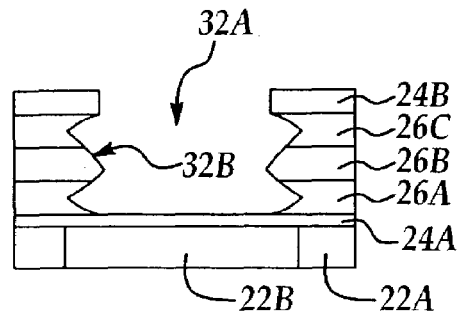

Referring to FIG. 2D, according to the present invention, the bonding pad opening is subjected to a preferential etching process whereby the passivation layers forming the sidewalls 32B of the bonding pad opening 32A are stacked to have alternating etching selectivities, e.g., USG layer 26A followed by FSG layer 26B, followed by USG layer 26C, are preferentially etched to form a roughened surface, forming for example, serpentine shaped sidewalls 32B. The preferential etching process preferably includes at least one of a wet and dry etching process.

For example, in an exemplary wet etching process, a hydrogen fluoride (HF) etching solution having a concentration of HF from about 0.5% to about 50% is used in at least one of a dipping and spraying process, such wet etching methods known in the art. The HF solution is preferably maintained at a temperature between about 10° C. and about 60° C. For example, the dipping process may include a single wafer process or a batch wafer process where the semiconductor wafers including the bonding pad opening(s) are immersed in the etching solution for a sufficient period of time to achieve a desired surface roughness. It will be appreciated that the time of immersion will depend on the etching rate of the materials, the concentration of the hydrogen fluoride solution and the solution temperature, and the degree of preferential etching desired. Alternatively, the preferential etching process may be carried out by a wet etching process using an ammonium fluoride ($NH_4F$) etching solution having a concentration of $NH_4F$ from about 1% to about 50% with the etching solution maintained at a temperature between about 10° C. and about 60° C.

In another exemplary embodiment, the preferential etching process may be carried by a dry plasma etching or reactive ion etching (RIE) process using a fluorocarbon containing etch chemistry, for example where $C_xF_y$, (x and y representing the carbon and fluorine stoichiometric ratio respectively) includes x having a value of about 1 to about 5 and y having a value of about 2 to about 12. Alternatively, the etching chemistry including chlorine containing gases such as $Cl_2$ and $BCl_3$ may be suitably used for the preferential RIE (dry etching) etching process. For example, the preferential dry etching process may be carried out in a conventional RIE etching chamber or a high density plasma (HDP) etching chamber, for example at a pressure of from about 4 milliTorr to about 200 milliTorr. In an exemplary dry etching process, the RF power may range from about 200 Watts to about 2500 Watts.

Figure 3:
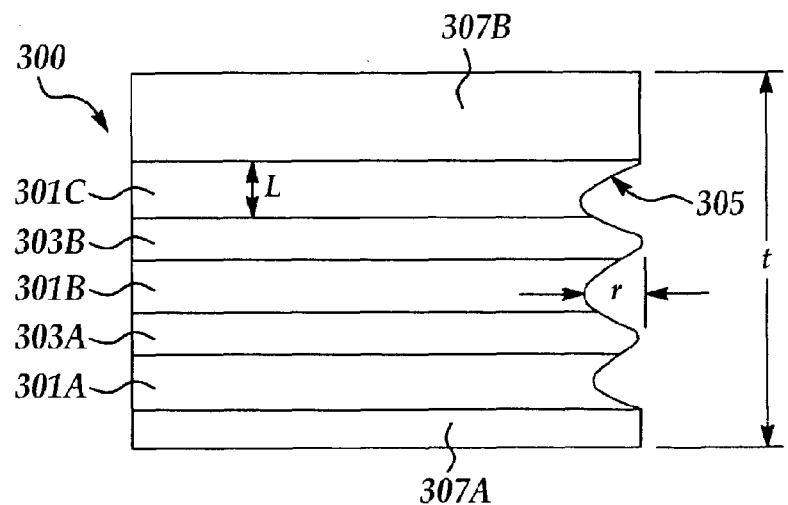
FIG. 3 is a cross sectional side view of an expanded portion of a portion of an exemplary bonding pad opening showing an exemplary embodiment of preferentially etched sidewalls according to the present invention.

Referring to FIG. 3, is shown an expanded portion of a portion of an anisotropically etched bonding pad opening 300 showing one sidewall 305 including a multi-layer series (plurality) of passivation layers including for example alternating dielectric insulating layers having different etching selectivities, for example, alternating layers of USG and FSG layers sandwiched between, for example, etching resistant layers e.g., silicon nitride layers 307A and 307B. Alternating layers of relatively high etching rate dielectric insulating layers e.g., 301A, 301B, 301C, and relatively low etching rate dielectric insulating layers e.g., 303A, 303B are interleaved (alternated) to achieve preferential etching in the preferential etching process to produce a roughened sidewall surface 305 having, for example, a serpentine shape. Each of the dielectric insulating layers has a thickness, e.g., L of between about 100 Angstroms and about 1000 Angstroms. According to the selective etching process, preferentially etched recesses e.g., r are formed in the sidewalls where r represents a maximum etching depth in a high etching rate dielectric insulating layer, e.g., 301B measured from the sidewall surface position of an adjacent low etching rate insulating layer, e.g., 303A or 303B (e.g., peak to valley in a serpentine shape) having a value of between about 200 Angstroms and about 700 Angstroms. The total depth t of the bonding pad opening above silicon nitride layer 307A is preferably between about 0.3 microns to about 5 microns. Preferably, the etching rates of the high etching rate dielectric insulating layers e.g., 301A, 301B, 301C, compared to the etching rates of the low etching rate dielectric insulating layers e.g., 303A, 303B have an etching rate ratio of about 2:1 to about 50:1.

Figure 2E:
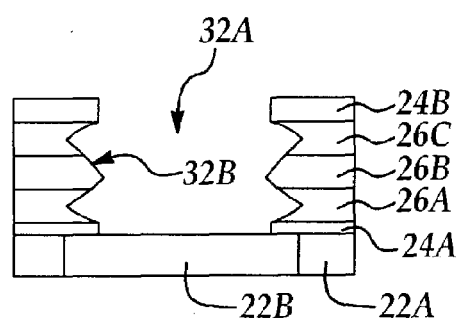
Figure 2F:
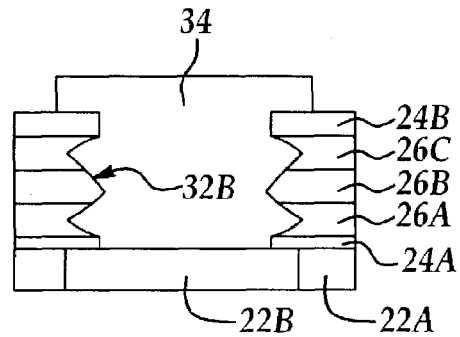

Referring to FIG. 2E, following the preferential etching process according to embodiments of the present invention the silicon nitride etching stop liner 24A is anisotropically etched according to a conventional RIE or plasma etching process through a thickness to expose the underlying copper area 22B. Referring to FIG. 2F, the bonding pad opening 32A is filled with metal, for example aluminum or an aluminum copper alloy by conventional processes to form metal bonding pad 34. For example, the bonding pad may be filled by either a PVD or CVD process including a first PVD process followed by a CVD process. For example a conformal layer of aluminum may be first deposited by a PVD sputtering or CVD process followed by a PVD sputtering process to deposit an aluminum/copper alloy. Other processes for metal deposition of aluminum and aluminum/copper alloys as are known in the art are also suitable for metal filling the bonding pad.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A metal filled semiconductor feature with improved structural stability comprising:

a metal filling an opening extending through a plurality of stacked dielectric layers, said opening forming closed communication with an underlying conductive area, said opening further comprising sidewalls having isotropically etched sidewall surfaces forming serpentine shaped sidewall surfaces;

wherein said serpentine shaped sidewall surfaces comprise peaks and valleys alternating according to a stacking sequence of the plurality of stacked dielectric layers, said stacking sequence comprising alternating etching rates according to a relatively higher and a relatively lower etching rate; and, wherein only said sidewalls comprise said serpentine shaped surface comprising said opening.

2. The metal filled semiconductor feature of claim 1, wherein the plurality is sandwiched between a lowermost etching resistant layer and an uppermost etching resistant layer comprising said sidewalls.

3. The metal filled semiconductor feature of claim 2, wherein the lowermost etching resistant layer and the uppermost etching resistant layer are selected from the group consisting of silicon nitride and silicon oxynitride.

4. The metal filled semiconductor feature of claim 1, wherein the stacking sequence comprises individual dielectric layers having sequentially alternating etching rates according to a relatively higher etching rate and a relatively lower etching rate with respect to an adjacently disposed dielectric layer comprising the plurality.

5. The metal filled semiconductor feature of claim 1, wherein the plurality comprises adjacent dielectric layers formed of undoped silica glass (USG) and fluorinated silica glass (FSG).

6. The metal filled semiconductor feature of claim 1, wherein the stacking sequence comprises a lowermost dielectric layer having a relatively higher etching rate followed by an overlying dielectric insulating layer having a relatively lower etching rate, wherein the stacking sequence is repeated upwardly to end with an uppermost dielectric layer having the relatively higher etching rate.

7. The metal filled semiconductor feature of claim 1, wherein the relatively higher etching rate and the relatively lower etching rate having a respective etching rate ratio of about 2:1 to about 50:1.

8. The metal filled semiconductor feature of claim 1, wherein the metal filled semiconductor feature comprises a bonding pad comprising at least one of aluminum and copper having a thickness of about 0.3 microns to about 5 microns.

9. The metal filled semiconductor feature of claim 1, wherein each of the plurality of stacked dielectric layers has a thickness of from about 100 Angstroms to about 1000 Angstroms.

10. The metal filled semiconductor feature of claim 9, wherein the sidewall surfaces comprise a peak to valley distance measured perpendicular to the thickness of about 200 Angstroms to about 700 Angstroms.

11. The metal filled semiconductor feature of claim 8, wherein the stacked dielectric layers comprise passivation layers overlying a conductive area comprising an inter-metal dielectric (IMD) layer.

12. The metal filled semiconductor feature of claim 1, wherein said conductive area comprises copper.

13. The metal filled semiconductor feature of claim 1, wherein the valleys of said sidewall surfaces comprise a depth of from about ½ to about twice the thickness the dielectric layer comprising the valley.

14. A metal filled semiconductor feature with improved structural stability comprising:

a metal filling an opening, said opening extending through a plurality of stacked dielectric layers, said opening disposed in closed communication with an underlying non-roughened conductive area;

said opening further comprising sidewalls having isotropically etched sidewall surfaces forming serpentine shaped sidewall surfaces;

wherein said serpentine shape comprises peaks and valleys alternating according to a stacking sequence of the plurality of stacked dielectric layers, said plurality comprising adjacent dielectric layers having alternating etching rates according to a relatively higher and a relatively lower etching rate.

15. The metal filled semiconductor feature of claim 14, wherein the plurality comprises dielectric layers having sequentially alternating etching rates according to a relatively higher etching rate and a relatively lower etching rate with respect to an adjacently disposed dielectric layer comprising the plurality.

16. The metal filled semiconductor feature of claim 14, wherein the plurality is sandwiched between a lowermost etching resistant layer and an uppermost etching resistant layer comprising said sidewalls.

17. The metal filled semiconductor feature of claim 14, wherein the plurality of stacked dielectric layers comprises adjacent dielectric layers formed of undoped silica glass (USG) and fluorinated silica glass (FSG).

18. The metal filled semiconductor feature of claim 14, wherein the metal filled semiconductor feature comprises a bonding pad comprising at least one of aluminum and copper having a thickness of about 0.3 microns to about 5 microns.

19. A bonding pad with improved structural stability comprising:

a metal filling an opening, said opening extending through a plurality of stacked passivation layers, said opening disposed in closed communication with an underlying non-roughened conductive area;

said opening further comprising sidewalls having isotropically etched sidewall surfaces forming serpentine shaped sidewall surfaces;

wherein said serpentine shape comprises peaks and valleys alternating according to a stacking sequence of the plurality of stacked passivation layers, said plurality comprising adjacent dielectric layers having sequentially alternating etching rates according to a relatively higher and a relatively lower etching rate.

20. The metal filled semiconductor feature of claim 19, wherein the plurality is sandwiched between a lowermost etching resistant passivation layer and an uppermost etching resistant passivation layer comprising said sidewalls.

* * * * *